Figure 1:
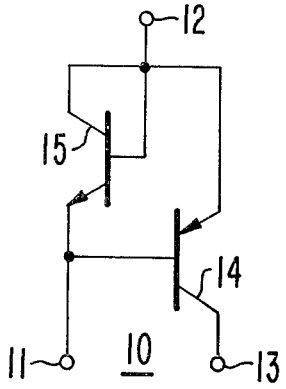
Figure 2:
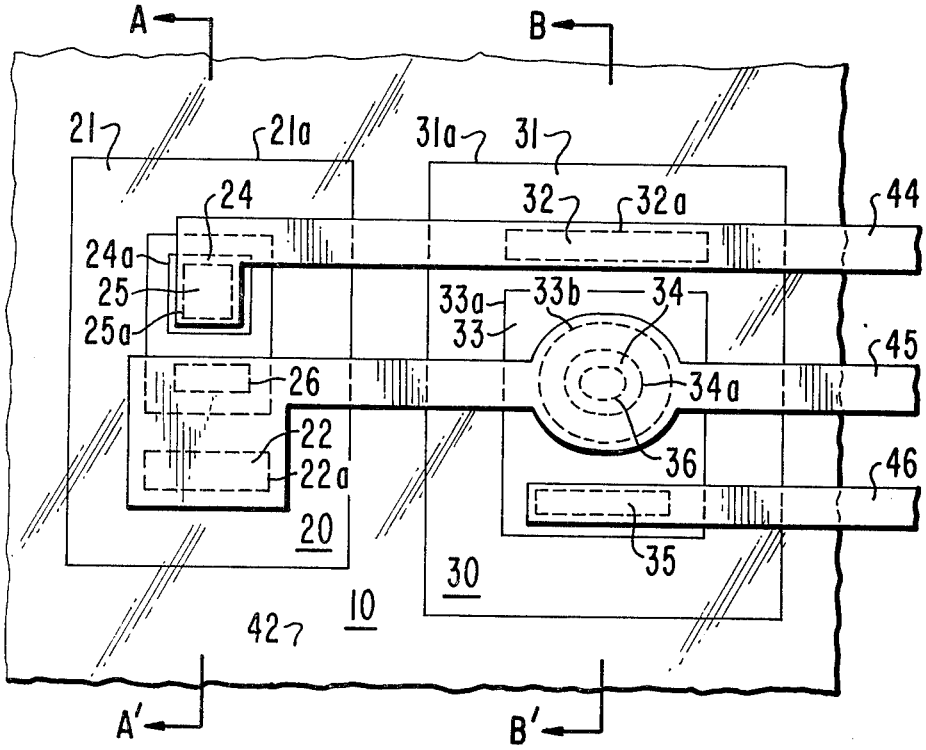
Figure 3:
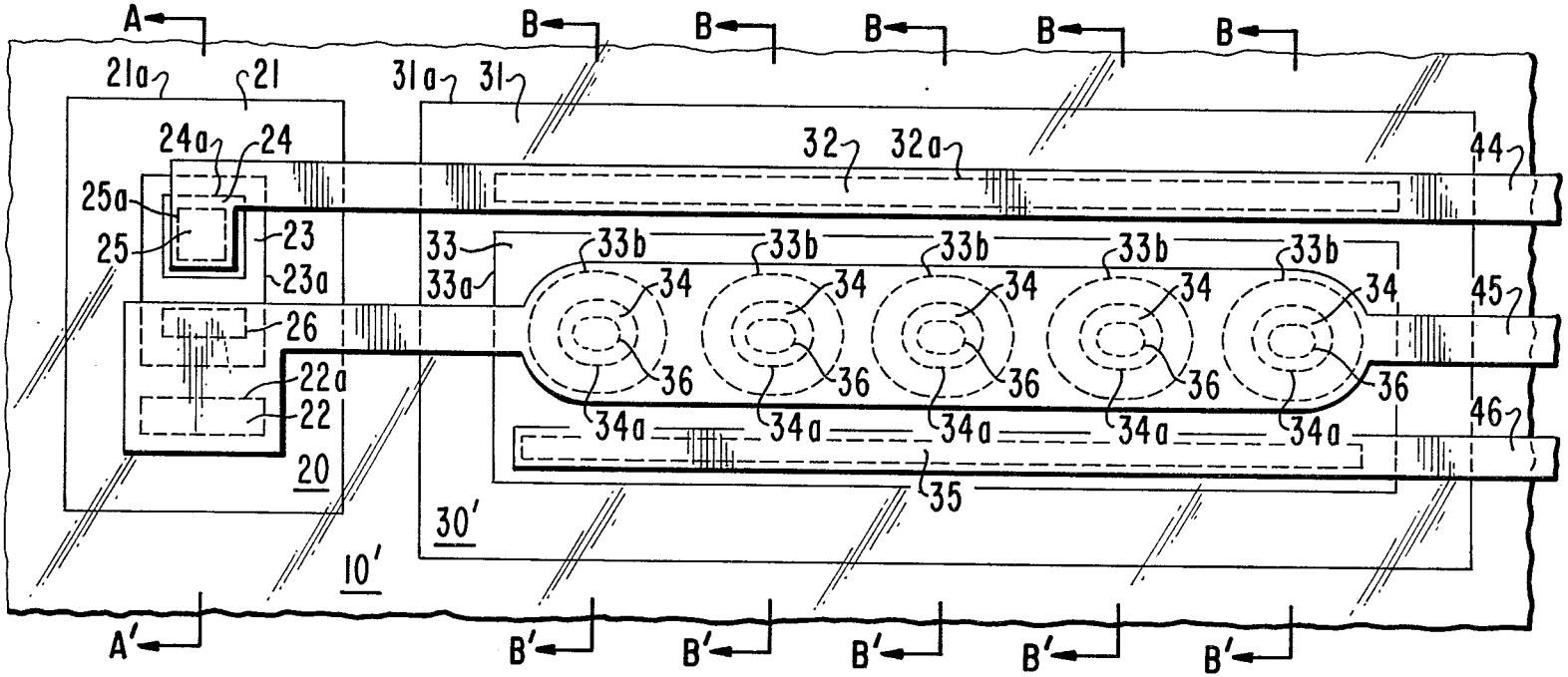
Figure 5:
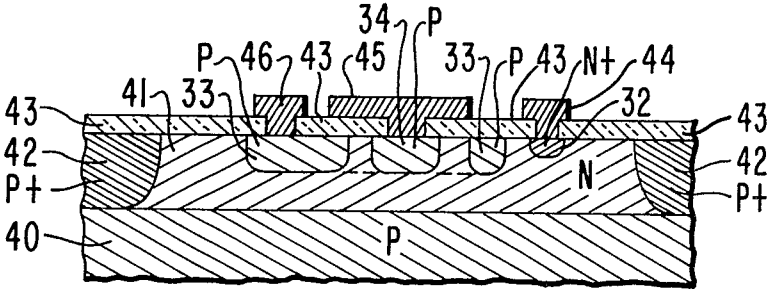
Figure 4:
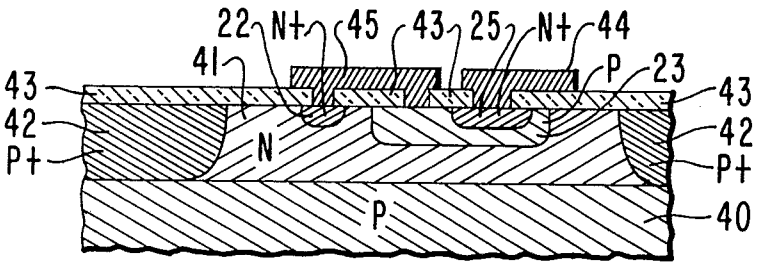

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED MAY 6, 1975

934 OG 9

T934,009
COMPOSITE TRANSISTOR
Abel Ching Nam Sheng, Morris Plains, N.J., assignor to RCA Corporation
Filed Apr. 11, 1974, Ser. No. 459,953
Int. Cl. H01l *19/00*
U.S. Cl. 357—44
2 Sheets Drawing. 10 Pages Specification

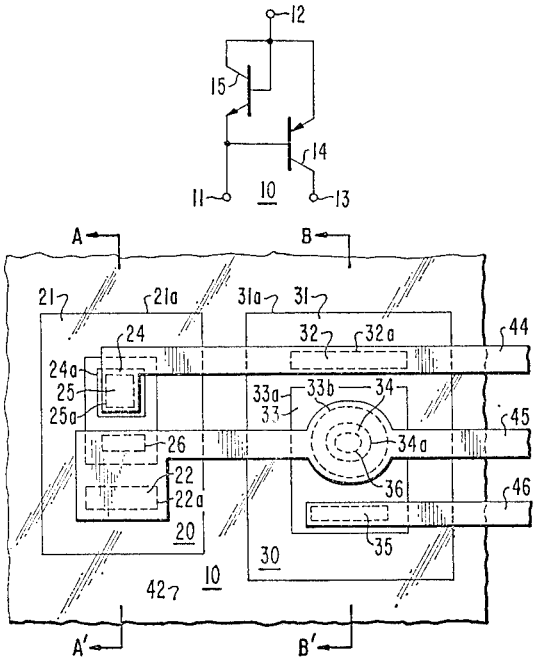

The composite transistor integrated within a common semiconductor body comprises a common-emitter amplifier connection of a lateral-structure transistor with its base-emitter junction paralleled by a diode-connection of a vertical-structure transistor. The magnitude of the "common-emitter forward current gain" of the composite transistor is the ratio of a saturation current of the lateral-structure transistor to the saturation current of the vertical structure transistor, which current gain is shown to be independent of temperature.

May 6, 1975

ABEL CHING NAM SHENG

T934,009

COMPOSITE TRANSISTOR

Filed April 11, 1974

2 Sheets-Sheet 1

May 6, 1975

ABEL CHING NAM SHENG

T934,009

COMPOSITE TRANSISTOR

Filed April 11, 1974

2 Sheets-Sheet 2

PLAN

SECTION B-B'

SECTION A-A'